United States Patent
Frazier et al.

(10) Patent No.: US 7,720,665 B1
(45) Date of Patent: May 18, 2010

(54) METHOD AND SYSTEM FOR REALIZING RESET IN DISCRETE EVENT SIMULATION

(75) Inventors: George Franklin Frazier, Lawrence, KS (US); Qizhang Chao, Palo Alto, CA (US); Tuay-Ling Kathy Lang, Boxborough, MA (US); Neeti Khullar Bhatnagar, San Jose, CA (US); Andrew Robert Wilmot, Carisle, MA (US)

(73) Assignee: Cadence Design Systems, Inc., San Jose, CA (US)

( * ) Notice: Subject to any disclaimer, the term of this patent is extended or adjusted under 35 U.S.C. 154(b) by 811 days.

(21) Appl. No.: 11/417,725

(22) Filed: May 4, 2006

(51) Int. Cl.
*G06F 17/50* (2006.01)
(52) U.S. Cl. .......... 703/16; 717/163
(58) Field of Classification Search .......... 703/13, 703/16; 717/163
See application file for complete search history.

(56) References Cited

U.S. PATENT DOCUMENTS

| | | | | |
|---|---|---|---|---|
| 6,902,481 | B2 * | 6/2005 | Breckner et al. | 463/30 |
| 7,050,958 | B1 * | 5/2006 | Bortfeld et al. | 703/15 |
| 2006/0026584 | A1 * | 2/2006 | Muratori et al. | 717/163 |

OTHER PUBLICATIONS

Panda, Preeti Ranjan ("SystemC—A Modeling Platform Supporting Multiple Design Abstractions", ISSS'01, Oct. 1-3, 2001.*
Rixner, Scott, "Memory System Architecture for Real-Time Multitasking Systems", Massachusetts Institute of Technology, May 2005, pp. 1-9, 47-52.*
W.T. Tsai et al., "A Scenario-Based Service-Oriented Rapid Multi-Agent Distributed Modeling and Simulation Framework for Sos/SOA and Its Applications", Oct. 2004, Foundations '04: A Workshop for VV&A in the 21$^{st}$ Century, Tempe, Arizona, pp. 1-94.*

* cited by examiner

*Primary Examiner*—Paul L Rodriguez
*Assistant Examiner*—Mary C Jacob
(74) *Attorney, Agent, or Firm*—McDermott Will & Emery LLP

(57) ABSTRACT

A system for controlling reset in discrete event simulation is disclosed. The system includes a simulator configured to effect the discrete event simulation, the simulator having a plurality of shared executable files, a memory configured to store the simulator for execution, an operating system having a loading/unloading facility, and a control program configured to effect a reset operation by directing the operating system to unload the simulator from the memory and then reload the simulator into the memory using the loading/unloading facility.

16 Claims, 3 Drawing Sheets

METHOD AND SYSTEM FOR REALIZING RESET IN DISCRETE EVENT SIMULATION

CROSS-REFERENCE(S) TO RELATED APPLICATION(S)

Not Applicable.

STATEMENT AS TO RIGHTS TO INVENTIONS MADE UNDER FEDERALLY SPONSORED RESEARCH OR DEVELOPMENT

Not Applicable.

BACKGROUND OF THE INVENTION

The present invention generally relates to event simulation and, in particular, to methods and systems for realizing reset in discrete event simulation.

Simulation is used to obtain information or validate/invalidate hypothesis about the events being simulated. Generally, event simulation is iterative in nature. During a simulation session, a common sequence of events is simulated for some amount of time. The simulation state is investigated periodically. Based on the investigation results, one or more simulation parameters may be modified before the simulation is started again from the beginning. Reset is the act of starting the simulation again from the beginning. Reset is helpful during a simulation session where the discovery of certain information is made at a particular time. Upon such discovery, the simulation may be reset and then run again from the initial state based on the newly discovered information. Consequently, providing the ability to reset a simulation is an important capability for discrete event simulation tools.

Typically, prior solutions for implementing reset during simulation are programmatic. One such programmatic solution for achieving reset is to provide a set of functions that effect assignments to "0" for each simulation variable in each program included in the simulator. When reset is desired, a control program calls these functions. It is programmatic in the sense that the actual act of reset is made possible by the manual creation of specially designed program functions ("reset functions") that make one or more assignments to the simulation variables in order to return the simulation to its initial state.

The programmatic approach has a number of disadvantages. First, it is common practice to include initialization actions in the initialization routines of a program. For the programmatic approach to work, these routines must be either explicitly called again or initialization code needs to be created in specially designed reset functions. Secondly, a public interface for creating and calling these functions has to be provided if the simulator is allowed to include simulation modules that are created externally. In most cases, the user of a simulator can create their own programming code that is called by the simulator. This code has its own variables that are part of the simulation state. For reset, these variables need to be reset to an initial state, such as, "0". The simulator controls the reset action. As a result, the simulator has to know how to call the reset functions in the code provided by the user. The ability to call the reset functions has to be provided for via a public interface. Information relating to the public interface is usually made available to the user by a documentation manual. Finally, there can be millions of variables in a simulator. Each needs to be re-assigned for true reset to occur. The chances of a programmer omitting some of the necessary assignments increase as the simulator becomes more complex. Thus, for complex simulators, programmatic reset is an error-prone strategy that becomes less maintainable every time the simulator is extended as part of the normal software development life cycle.

Hence, it would be desirable to provide methods and systems that are capable of, amongst other things, realizing reset in discrete event simulation in a more efficient manner and avoiding the disadvantages of prior art systems as described above.

SUMMARY OF THE INVENTION

In one embodiment, a system for controlling reset in discrete event simulation is disclosed. The system includes a simulator configured to effect the discrete event simulation, the simulator having a plurality of shared executable files, a memory configured to store the simulator for execution, an operating system having a loading/unloading facility, and a control program configured to effect a reset operation by directing the operating system to unload the simulator from the memory and then reload the simulator into the memory using the loading/unloading facility.

In another embodiment, a simulation environment is disclosed. The simulation environment includes a simulator configured to effect discrete event simulation, the simulator having a number of model programs and a simulation engine, the model programs having a number of shared executable files and the simulation engine having a shared executable library, a memory configured to store the simulator for execution, an operating system having a loading/unloading facility, and a control program configured to reset the simulator to its initial simulation state by directing the operating system to unload the simulation engine and the model programs from the memory and then reload the simulation engine and the model programs into the memory using the loading/unloading facility.

In yet another embodiment, a computer readable medium having a number of instructions stored thereon is disclosed. The instructions are executable by a processor and configured to control reset in discrete event simulation by loading a number of model programs and a simulation engine into a memory, the model programs including a number of shared executable files and the simulation engine having a shared executable library, the model programs being linked against the simulation engine, directing an operating system to unload the model programs from the memory, and directing the operating system to reload the model programs into the memory after the unloading of the model programs from the memory is completed. The loading and reloading of the model programs reset the discrete event simulation to its initial simulation state.

In one aspect, a method for providing reset in discrete event simulation is disclosed. The method includes effecting the discrete event simulation using a simulator loaded in a memory, using a control program to direct an operating system to unload the simulator from the memory upon detecting a reset condition during the discrete event simulation, and using the control program to direct the operating system to reload the simulator into the memory after the unloading of the simulator is completed.

In another aspect, a method for managing a run-time simulation environment includes loading a simulator into a memory to effect discrete event simulation, the simulator having a number of model programs and a simulation engine, the model programs including a number of shared executable files and the simulation engine having a shared executable library, the model programs being linked against the simulation engine, directing an operating system to unload the model programs from the memory, and directing the operating system to reload the model programs into the memory after the unloading of the model programs from the memory is completed. The loading and reloading of the model programs reset the simulator to its initial simulation state.

Reference to the remaining portions of the specification, including the drawings and claims, will realize other features and advantages of the present invention. Further features and advantages of the present invention, as well as the structure and operation of various embodiments of the present invention, are described in detail below with respect to accompanying drawings, like reference numbers indicate identical or functionally similar elements.

BRIEF DESCRIPTION OF THE DRAWINGS

Aspects, advantages and novel features of the present invention will become apparent from the following description of the invention presented in conjunction with the accompanying drawings.

DETAILED DESCRIPTION OF SPECIFIC EMBODIMENTS

Figure 1:
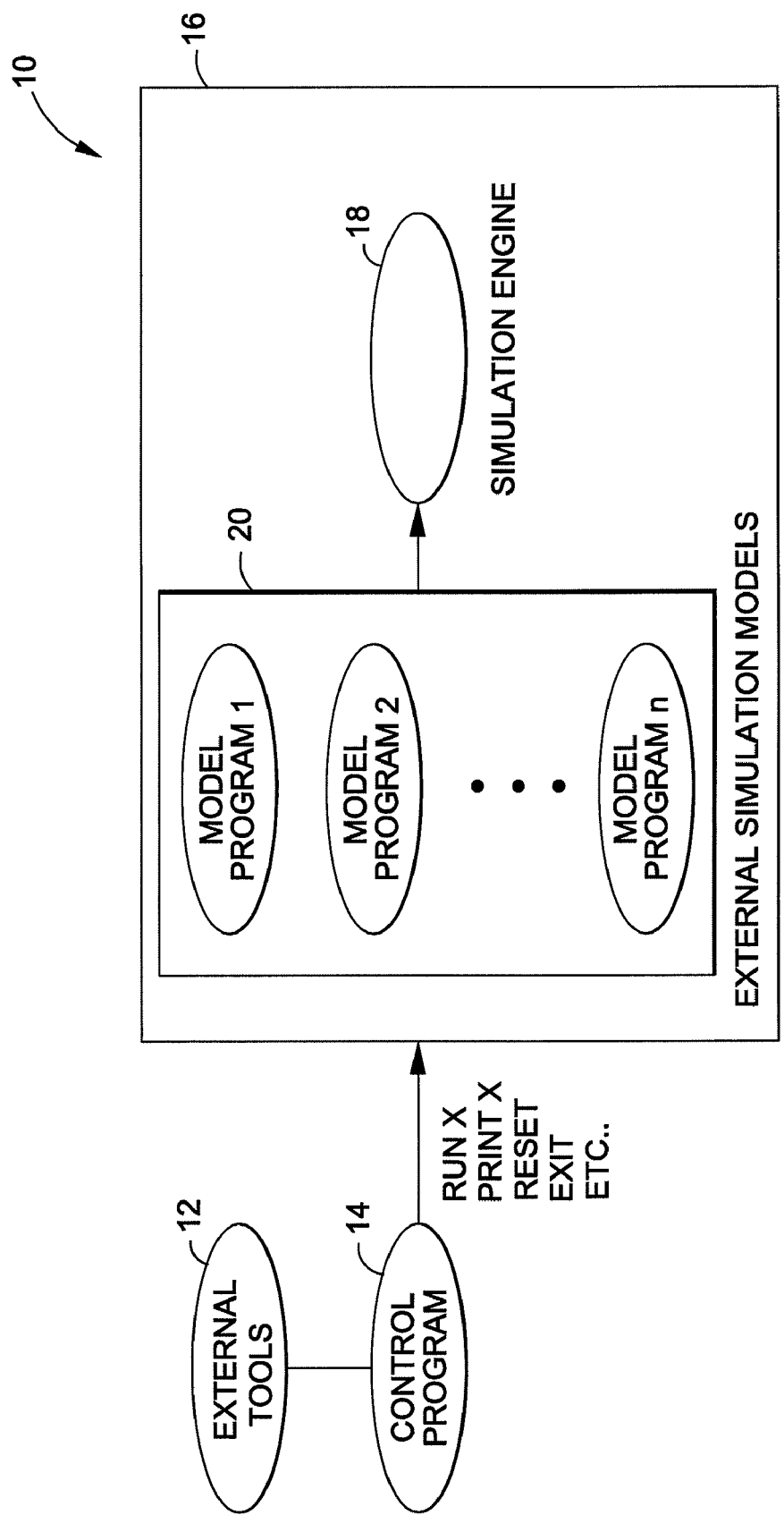
FIG. 1 is a simplified schematic block diagram illustrating one embodiment of the present invention.
Figure 2:
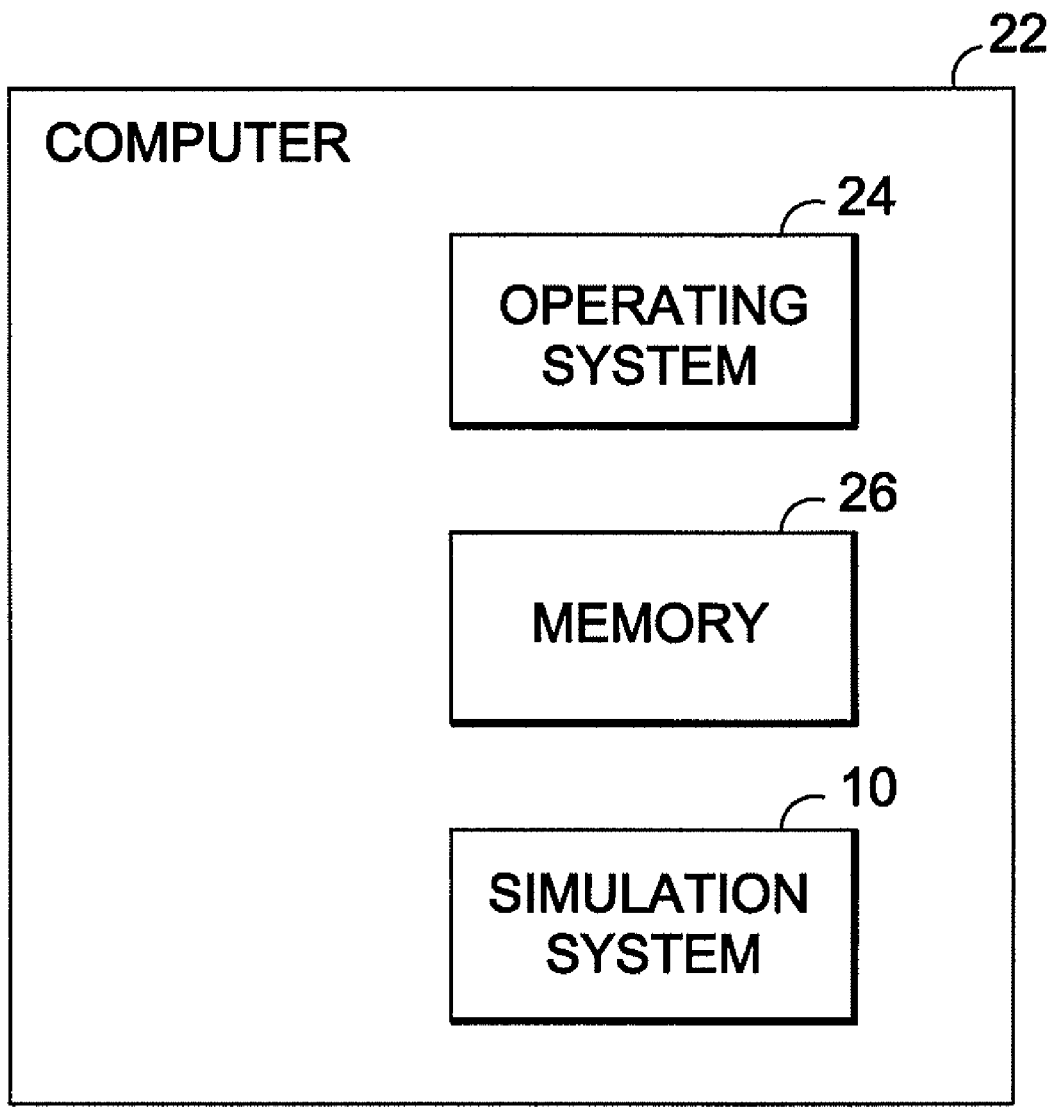
FIG. 2 is a simplified schematic block diagram illustrating a run-time environment that may be used to implement one embodiment of the present invention.

One or more embodiments of the present invention will now be described. The present invention provides a simple, reliable and non-programmatic solution that may be used to realize reset in simulation. FIG. 1 illustrates an embodiment of the present invention. In one embodiment, the system 10 includes a number of external tools 12 (such as debuggers and visualization and analysis programs), a control program 14 and a simulator 16. The simulator 16 may further include a simulation engine 18 and a number of external simulation models 20 implemented as model programs 1 . . . n. As shown in FIG. 2, the system 10 may be part of a larger run-time environment including, for example, a computer 22 having an operating system 24 and a memory 26. The operating system 24 of the computer 22 may contain functions for loading and unloading executable files into and out of the memory 26.

The state of the simulator 16 can be defined as a set of values, one for each variable used by the simulator 16, at any given simulation time. Simulation time is typically defined as a non-negative, increasing integer. The initial simulation state of a simulation is the set of values for the corresponding variables when the value of simulation time is at some predetermined initial value, such as, zero (0). The respective states of the control program 14 and the external tools 12 are separate from the state of the simulator 16.

The control program 14 is configured to communicate with the external tools 12 and control the simulator 16 using four (4) functions including, "run x", "print y", "reset", and "exit". "run x" represents a command that is used to start and run the simulator 16 for "x" simulation time units where "x" is an integer greater than zero (0). "print y" represents a command that is used to print the value of a simulation variable "y" thereby allowing a simulation state to be examined. "reset" represents a command that is used to reset the simulator 16 to its initial state. "exit" represents a command that is used to end simulation being performed by the simulator 16. The four (4) functions described above are provided for illustrative purposes only. It should be noted that many other functions may be implemented and used by the control program 14 to control the simulator 16.

The "reset" command is used by the control program 14 to reset the simulator 16. Simulation is said to be reset when actions are taken by the control program 14 to return the simulation state of the simulator 16 to its initial state, i.e., to create a situation where each variable in the simulator 16 has the same value it had in the initial state. Typically, the value of a variable in the simulator 16 in the initial state is zero (0), although other values may be used.

The control program 14 can be implemented in software as an executable program whose purpose is to communicate with the external tools 12 and implement a number of functions for controlling the simulator 16. As noted above, the simulator 16 includes the simulation engine 18. The simulation engine 18 is configured to effect simulation by executing the external simulation models 20. In one embodiment, the simulation engine 18 is implemented using a SystemC simulator and C++ class library implemented as a shared executable library; and the external simulation models 20 implemented as model programs 1 . . . n correspond to one or more modules of C++ that represent the behavior of the models under simulation. The model programs 1 . . . n are also shared executable libraries or programs and may be created by the user of the simulator 16. The model programs 1 . . . n are able to make SystemC library calls.

The simulation engine 18 and the external simulation models 20 are executable files that can be loaded and unloaded into the memory 26 via the operating system's interface. In one example using SystemC, the model programs 1 . . . n are linked against the SystemC simulator and C++ class library via the operating system's facilities for linking executable code.

Figure 3:
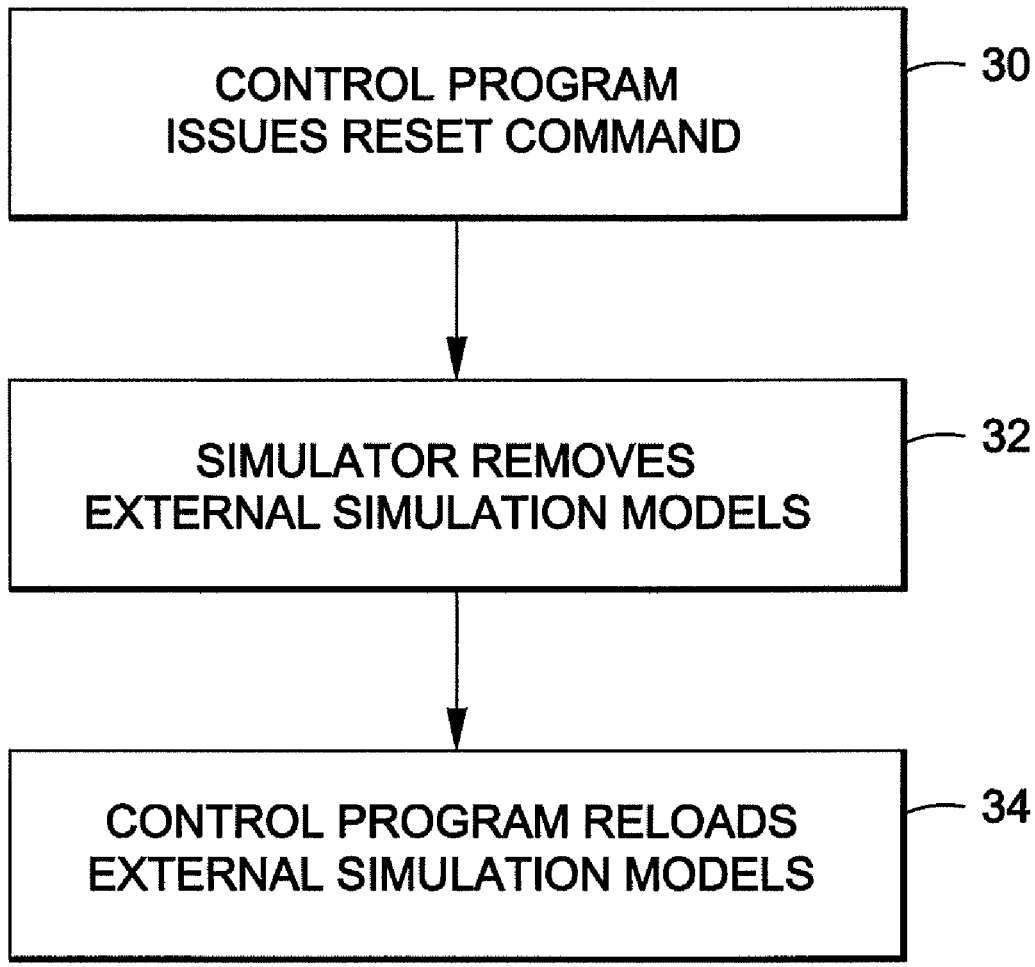
FIG. 3 is a flowchart illustrating the reset operation effected by one embodiment of the present invention.

FIG. 3 is a flowchart illustrating the reset operation effected by the system 10. At block 30, when a reset is desired during simulation, the control program 14 initiates reset by issuing the "reset" command to the simulator 16. At block 32, upon receiving the "reset" command, the simulator 16 iterates through the external simulation models 20 (each an executable program running in memory 26) using the facility provided by the operating system 24 for unloading executable files one at a time. In one example where a Unix operating system is used, the routine for loading an executable file is called "dlopen" and the routine for unloading an executable file is called "dlclose". The unloading order of the external simulation models 20 may vary depending on the characteristics and/or constraints of the operating system 24 and the computer 22. At the end of the unloading process, according to the semantics of the functions called to unload the external simulation models 20, the dependencies are such that each model is successfully unloaded. Furthermore, since the external simulation models 20 are linked against the simulation engine 18, the simulation engine 18 itself is also unloaded from the memory 26. Thus, the entire simulator 16 including the external simulation models 20 and the simulation engine 18 is removed from the memory 26. It should be noted that, in an alternative embodiment, the control program 14 may also explicitly cause the external simulation models 20 and the simulation engine 18 to be unloaded from the memory 26.

At block 34, once the unloading process is successfully completed, the external simulation models 20 are then reloaded by the control program 14 in the same order as they were originally loaded when the simulation began, thereby preserving simulation semantics. This unloading/reloading causes the variables of the simulator 16 in the simulation engine 18 and in the external simulation models 20 to be reset to their initial state. As noted above, the initial state may have a value of zero (0), although other values may be used. Similarly, since the external simulation models 20 are linked against the simulation engine 18, the simulation engine 18 itself is also reloaded into the memory 26. In an alternative embodiment, the control program 14 may also explicitly cause the external simulation models 20 and the simulation engine 18 to be reloaded into the memory 26.

When the executable files of the simulator 16 are unloaded and then later re-loaded into the memory 26, the value of each variable in the executable files is in effect reset for at least two reasons. First, because the value of a variable is stored in the memory 26 and the unloading/reloading sequence changes the memory address of a variable, the value of a variable will not remain the same after the unloading/reloading process. Secondly, when an executable file is loaded into the memory 26, the operating system 24 calls the initialization functions of the executable file. The calling of such initialization functions causes a sequence of events to occur that set the values of the variables in the executable file to their initial state. Therefore, by using the control program 14 to direct the unloading and reloading of the executable files of the simulator 16, the initial simulation state is attained without the introduction of manually produced reset functions in the simulator 16. As a result, the facilities of the computer's operating system 24 are used to achieve reset in a non-programmatic fashion.

Based on the disclosure and teachings provided herein, one skilled in the art would appreciate that the present invention may be implemented using other types of simulation languages. The present invention can also be applied to a single mixed-language simulator. Furthermore, the present invention is not limited to programs written in any specific language as long as such program are represented as executable files capable of being loaded and unloaded from memory by an operating system.

The present invention has a number of advantages and/or benefits. For example, the present invention does not require the use of a public interface to allow reset functions to be called. Also, there is no need to keep track of simulator variables. The external simulation models 20 are unloaded and re-loaded from and into the memory 26 each time reset occurs. Furthermore, initialization is a more complex problem for programs written in C++ that contain advanced programming features such as templates. Discrete event simulation is just now beginning to deal with C++(especially via SystemC) and a non-programmatic solution for reset is especially helpful with these newer SystemC-aware simulators.

The methods or algorithms described in connection with the embodiments disclosed herein may be embodied directly in hardware, in a software module executable by a processor, or in a combination of both, in the form of control logic, programming instructions, or other directions, and may be contained in a single device or distributed across multiple devices. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

The previous description of the disclosed embodiments is provided for purposes of illustration and description to enable any person skilled in the art to make or use the present invention. It is not intended to be exhaustive or to limit the invention to the precise form disclosed. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein, but is to be accorded the full scope consistent with the claims, wherein reference to an element in the singular is not intended to mean "one and only one" unless specifically so stated, but rather "one or more". All structural and functional equivalents to the elements of the various embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for".

What is claimed is:

1. A system for controlling reset in discrete event simulation, the system comprising:
   a simulator configured to be executed by a processor to effect the discrete event simulation, the simulator including a plurality of shared executable files and a plurality of external simulation models;
   a memory configured to store the simulator for execution;
   an operating system having a loading/unloading facility; and
   a control program configured to effect a reset operation by directing the operating system to unload the simulator from the memory and then reload the simulator into the memory using the loading/unloading facility,
   wherein the plurality of external simulation models are reloaded into the memory in the same order as they were originally loaded when the discrete event simulation began.

2. The system of claim 1 wherein the simulator further includes a simulation engine;
   wherein the plurality of external simulation models are created externally by a user; and
   wherein the plurality of external simulation models are linked against the simulation engine.

3. The system of claim 1 wherein the simulator is implemented using SystemC.

4. A run-time simulation environment incorporating the system as recited in claim 1.

5. A simulation environment comprising:
   a simulator configured to be executed by a processor to effect discrete event simulation, the simulator having a plurality of model programs and a simulation engine, the plurality of model programs having a plurality of shared executable files and the simulation engine having a shared executable library;
   a memory configured to store the simulator for execution;
   an operating system having a loading/unloading facility; and
   a control program configured to reset the simulator to its initial simulation state by directing the operating system to unload the simulation engine and the plurality of model programs from the memory and then reload the simulation engine and the plurality of model programs into the memory using the loading/unloading facility,
   wherein the plurality of model programs are reloaded into the memory in the same order as they were originally loaded when the discrete event simulation began.

6. The simulation environment of claim 5 wherein the plurality of model programs are created externally by a user; and wherein the plurality of model programs are linked against the simulation engine.

7. The simulation environment of claim 6 wherein the simulator is implemented using SystemC.

8. A method for providing reset in discrete event simulation, the method comprising:

effecting the discrete event simulation using a simulator, that includes a plurality of external simulation models, loaded in a memory;

using a control program to direct an operating system to unload the simulator from the memory upon detecting a reset condition during the discrete event simulation; and using the control program to direct the operating system to reload the simulator into the memory after the unloading of the simulator is completed, wherein the plurality of external simulation models are reloaded into the memory in the same order as they were originally loaded when the discrete event simulation began.

9. The method of claim 8 wherein the simulator further includes a simulation engine;

wherein the plurality of external simulation models are created externally by a user; and wherein the plurality of external simulation models are linked against the simulation engine.

10. The method of claim 8 wherein the simulator is implemented using SystemC.

11. A run-time simulation environment executing the method as recited in claim 8.

12. A computer readable medium having a plurality of instructions stored thereon, the plurality of instructions being executable by a processor and configured to execute the method as recited in claim 8.

13. A method for managing a run-time simulation environment, the method comprising:

loading a simulator into a memory to effect discrete event simulation, the simulator having a plurality of model programs and a simulation engine, the plurality of model programs including a plurality of shared executable files and the simulation engine having a shared executable library, the plurality of model programs being linked against the simulation engine;

directing an operating system to unload the plurality of model programs from the memory; and directing the operating system to reload the plurality of model programs into the memory, in the same order as they were originally loaded when the discrete event simulation began, after the unloading of the plurality of model programs from the memory is completed;

wherein the loading and reloading of the plurality of model programs reset the simulator to its initial simulation state.

14. The method of claim 13 wherein the plurality of model programs are created externally by a user.

15. The method of claim 13 wherein the simulator is implemented using SystemC.

16. A computer readable medium having a plurality of instructions stored thereon, the plurality of instructions being executable by a processor and configured to execute the method as recited in claim 13.

* * * * *